(12) United States Patent
He et al.

(10) Patent No.: US 9,368,350 B1
(45) Date of Patent: Jun. 14, 2016

(54) TONE INVERTED DIRECTED SELF-ASSEMBLY (DSA) FIN PATTERNING

(71) Applicant: International Business Machines Corporation, Armonk, NY (US)

(72) Inventors: Hong He, Schenectady, NY (US);
Chi-Chun Liu, Altamont, NY (US);
Alexander Reznicek, Troy, NY (US);
Chiahsun Tseng, Wynantskill, NY (US);
Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/747,487

(22) Filed: Jun. 23, 2015

(51) Int. Cl.
*H01L 21/302* (2006.01)
*H01L 21/033* (2006.01)
*H01L 21/027* (2006.01)

(52) U.S. Cl.
CPC ........ *H01L 21/0338* (2013.01); *H01L 21/0276* (2013.01); *H01L 21/0332* (2013.01); *H01L 21/0335* (2013.01); *H01L 21/0337* (2013.01)

(58) Field of Classification Search
CPC ............ H01L 21/0338; H01L 21/0276; H01L 21/0332
See application file for complete search history.

(56) References Cited

U.S. PATENT DOCUMENTS

| | | |
|---|---|---|
| 6,277,544 B1 | 8/2001 | Singh et al. |
| 6,780,736 B1 | 8/2004 | Holmes et al. |
| 8,138,097 B1 | 3/2012 | Isobayashi et al. |
| 8,298,943 B1 | 10/2012 | Arnold et al. |
| 8,470,711 B2 | 6/2013 | Arnold et al. |
| 8,771,929 B2 | 7/2014 | Guillorn et al. |
| 2012/0261828 A1 | 10/2012 | Bruce et al. |

OTHER PUBLICATIONS

Cheng, Joy Y., et al.; "Simple and Versatile Methods To Integrate Directed Self-Assembly with Optical Lithography Using a Polarity-Switched Photoresist"; ACS Nano; vol. 4, No. 8; pp. 4815-4823; 2010.

(Continued)

*Primary Examiner* — Nadine Norton
*Assistant Examiner* — Mahmoud Dahimene
(74) *Attorney, Agent, or Firm* — Cantor Colburn LLP; Vazken Alexanian

(57) ABSTRACT

A method for DSA fin patterning includes forming a BCP layer over a lithographic stack, the BCP layer having first and second blocks, the lithographic stack disposed over a hard mask and substrate, and the hard mask including first and second dielectric layers; removing the first block to define a fin pattern in the BCP layer with the second block; etching the fin pattern into the first dielectric layer; filling the fin pattern with a tone inversion material; etching back the tone inversion material that overfills the fin pattern; removing the first dielectric layer selectively to define an inverted fin pattern from the tone inversion material; etching the inverted fin pattern into the second dielectric layer of the hard mask; removing the tone inversion material; and transferring the inverted fin pattern of the second dielectric layer into the substrate to define fins.

20 Claims, 5 Drawing Sheets

(56) References Cited

OTHER PUBLICATIONS

Hitomi, Keiichiro, et al.; "Methodology for Establishing CD-SEM Robust Metrology Algorithm for Development Cycles Applications"; Proc. of SPIE; vol. 8324; pp. 83241G-1-83241G-8; 2012.

Holmes, Steven J.; "Optimization of Pitch-Split Double Patterning Photoresist for Applications at the 16nm Node"; IEEE; pp. 1-8; 2011.

Patel, Kedar, et al.; "Comparative Study of Line Width Roughness (LWR) in Next-Generation Lithography (NGL) Processes"; Proc. of SPIE; vol. 7640; pp. 76400T-1-76400T-13; 2010.

TONE INVERTED DIRECTED SELF-ASSEMBLY (DSA) FIN PATTERNING

BACKGROUND

The present invention generally relates to semiconductors, and more specifically, to semiconductor fin patterning.

Device scaling drives the semiconductor industry, which reduces costs, decreases power consumption, and provides faster devices with increased functions per unit area. Improvements in optical lithography have played a major role in device scaling. However, optical lithography has inherent limitations for minimum dimensions, which are determined by the wavelength of the irradiation.

Directed self-assembly (DSA) is an alternative method for forming periodic structures, such as one-dimensional arrays of semiconductor line structures. In order to convert the array of semiconductor line structures into semiconductor fins, portions of the semiconductor line structures are etched away by employing lithograhic stacks. DSA of block copolymers (BCPs) employs a topographical or chemical guiding pattern to direct the BCPs into a desired morphology at a pre-determined location. BCPs are made up of discrete blocks of different polymerized monomers, or monomer blocks. The BCP material properties control the feature size and uniformity of the resulting structures.

In one example, di-block copolymers, for example polystyrene (PS)/poly(methyl methacrylate) (PMMA) BCPs can be used to pattern fins, with PS and PMMA blocks defining where the fins and spaces between the fins will be, respectively. Reactive ion etching (RIE) is then used to remove the PMMA block and reduce the critical dimensions (CD) of the fins to achieve the final fin CD.

SUMMARY

In one embodiment of the present invention, a method for directed self-assembly (DSA) fin patterning includes forming a block copolymer layer over a lithographic stack, the block copolymer layer having a first block and a second block, the lithographic stack disposed over a hard mask and a substrate, and the hard mask including a first dielectric layer and a second dielectric layer; removing the first block from the block copolymer to define a fin pattern in the block copolymer layer with the second block; etching the fin pattern into the first dielectric layer of the hard mask; filling the fin pattern within the first dielectric layer of the hard mask with a tone inversion material; etching back the tone inversion material that overfills the fin pattern and remains on top of the first dielectric layer; removing the first dielectric layer selectively to define an inverted fin pattern from the tone inversion material; etching the inverted fin pattern into the second dielectric layer of the hard mask; removing the tone inversion material; and transferring the inverted fin pattern of the second dielectric layer into the substrate to define fins.

In another embodiment, a method for DSA fin patterning includes forming a block copolymer layer over a neutral layer, the block copolymer layer having a first block and a second block, the neutral layer disposed over a lithographic stack, the lithographic stack disposed over a hard mask and a substrate, and the hard mask including a first dielectric layer and a second dielectric layer; removing the first block from the block copolymer and a corresponding portion of the neutral layer beneath the first block to define a fin pattern in the block copolymer layer with the second block; etching the fin pattern into the first dielectric layer of the hard mask; filling the fin pattern within the first dielectric layer of the hard mask with a tone inversion material; etching back the tone inversion material that overfills the fin pattern and remains on top of the first dielectric layer; removing the first dielectric layer selectively to define an inverted fin pattern from the tone inversion material; etching the inverted fin pattern into the second dielectric layer of the hard mask; removing the tone inversion material; and transferring the inverted fin pattern of the second dielectric layer into the substrate to define fins.

Yet, in another embodiment, a method for DSA fin patterning includes forming a block copolymer layer over a lithographic stack, the block copolymer having a first block and a second block, the lithographic stack disposed over a hard mask and a substrate, and the hard mask including a first dielectric layer and a second dielectric layer; removing the first block from the block copolymer to define a fin pattern in the block copolymer layer with the second block; etching the fin pattern into the first dielectric layer of the hard mask; filling the fin pattern within the first dielectric layer of the hard mask with a tone inversion material; etching back the tone inversion material that overfills the fin pattern and remains on top of the first dielectric layer; removing the first dielectric layer selectively to define an inverted fin pattern from the tone inversion material; etching the inverted fin pattern into the second dielectric layer of the hard mask; removing the tone inversion material; transferring the inverted fin pattern of the second dielectric layer into the substrate to define fins; and etching the fins into the substrate after removing the tone inversion material.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 2A-3F illustrate a process flow for tone inverted DSA patterning in accordance with the present invention, in which:

FIG. 2A illustrates a cross-sectional side view of DSA lithographic patterning of a BCP stack over a lithographic stack, a hard mask stack, and the substrate 210;

FIG. 3F illustrates a cross-sectional side view after final fin etching into the substrate.

DETAILED DESCRIPTION

Figure 1B:
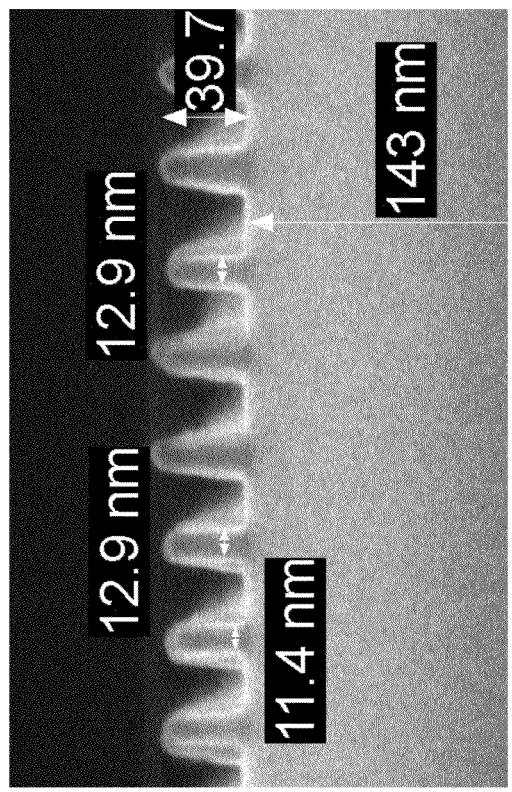
FIG. 1B is a cross-sectional side view of Si on insulator (SOI) illustrating a CD non-uniformity resulting from a limited etch mask budget.

As stated above, the present invention relates to semiconductors, and particularly to fin patterning, which are now described in detail with accompanying figures. It is noted that like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Figure 1A:
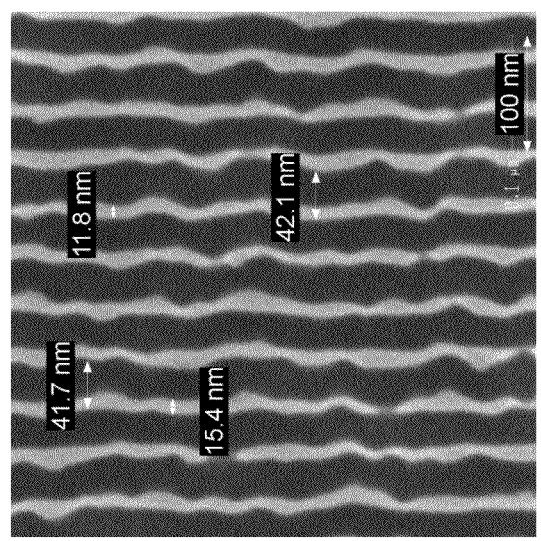
FIG. 1A is an example of top view SEM image with broken hard mask lines, line wiggling, and CD non-uniformity correlated to block copolymer, Si-containing anti-reflective coating, or organic planarization layer (OPL) etch issues.

When PS-PMMA BCPs are used, the PS line defines the final fin. Conventionally, PS-PMMA structures have equal lines and spaces. One would have to further reduce the CD by trimming at PS layer, anti-reflective coating layer, OPL layer, and/or underlying hard mask layers. However, the PS trimming also consumes the height of the PS template. Therefore, the mask budget for further etching would be limited. More aggressive anti-reflective coating (ARC) etching beneath the BCP can improve the PS line CD shrink. However, such aggressive etching relies on the PS mask budget and can result in CD non-uniformity by depleting the PS mask during ARC etching. Even more aggressive ARC+OPL etching beneath the PS mask can also help to shrink the PS line CD, but "OPL wiggling" (see FIG. 1A) and etch mask budget concerns limit its applicability because the OPL line aspect ratio is too high (see FIG. 1B).

The present invention solves the problems of OPL wiggling, limited etch mask budgets derived from the need for CD trimming of DSA structures, and the amount of RIE shrink necessary to provide fins with desired CDs. Instead of consuming the mask for CD trimming, this invention utilizes a CD growing (space narrowing) technique that consumes much less mask, such as taper etch, and combines tone-inversion to utilize the narrowed spaces to achieve the desired CD. Features are patterned into a first hard mask layer below a lithographic stack, the lithographic stack is stripped away, tone inversion is applied, the pattern is etch transferred into a second hard mask layer, the tone inversion material is stripped away, and then the final fin pattern is transferred into the substrate. The methods are compatible for bulk fin patterning. The disclosed methods also provide more room for final fin CD tuning.

Figure 2A:
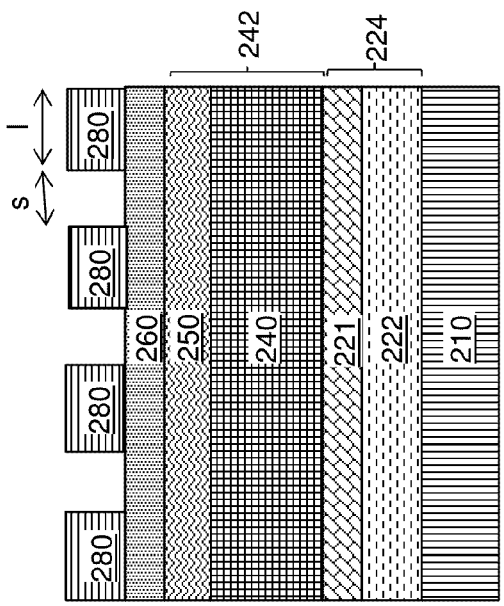

FIGS. 2A-3F illustrate a process flow for tone inverted DSA patterning in accordance with the present invention. FIG. 2A illustrates a cross-sectional side view of a semiconductor stack resulting from DSA lithographic patterning of a BCP 262. A hard mask 224 is formed over a substrate 210. The hard mask 224 includes a first dielectric layer 221 and a second dielectric layer. A lithographic stack 242 is formed over the hard mask 224. The lithographic stack 242 includes an organic planarization layer (OPL) 240 and an ARC layer 250. A neutral layer 260 is formed over the lithographic stack 242 to facilitate perpendicular morphology of the BCP and direct the alignment of the structures. The BCP 262 is formed over the neutral layer 260. The BCP 262 includes a first block 270 and a second block 280.

The substrate 210 can be a silicon substrate, a germanium substrate, a silicon on oxide substrate, a silicon on insulator substrate, a III-V heterogeneous semiconductor such as GaAs, InP and etc., or any combination thereof.

The substrate 210 thickness is not intended to be limited. In one aspect, the substrate 210 is SOI and has a thickness in a range from about 5 nanometers (nm) to about 100 nm. In another aspect, the substrate 210 is bulk Si and has a thickness in a range from about 700 micrometers (μm) to about 800 μm. Yet, in another aspect, the substrate 210 has a thickness about or in any range from about 0.1, 0.5, 1, 100, 250, 500, and 750 μm.

The first dielectric layer 221 and the second dielectric layer 222 are different dielectric materials. The first and second dielectric layers 221, 222 can be any suitable oxide material, oxide precursor material, or nitride material. Non-limiting examples of suitable materials include tetraethyl orthosilicate (TEOS), silicon dioxide, silicon nitride, or any combination thereof.

The first and second dielectric layers 221, 222 can be formed by any suitable methods. Non-limiting examples of suitable methods for forming the first and second dielectric layers 221, 222 include physical vapor deposition (PVD), chemical vapor deposition (CVD), plasma-enhanced chemical vapor deposition (PECVD), atomic layer deposition (ALD), or any combination thereof.

The OPL layer 240 and the ARC layer 250 are used as a lithographic stack 242 to pattern the underlying layers. The OPL layer 240 is formed at a predetermined thickness to provide reflectivity and topography control during etching of the hard mask 224 layers below. The OPL layer 240 includes an organic material, such as a polymer. The thickness of the OPL layer 240 is in a range from about 50 nm to about 300 nm.

The ARC layer 250 minimizes the light reflection during lithography. The ARC layer 250 can include silicon, for example, a silicon anti-reflective layer (SiARC). The thickness of the ARC layer 250 is in range from about 10 nm to about 100 nm.

The neutral layer 260 can be formed by spin-coating a suitable composition over the lithographic stack 242 and then annealing the coated neutral layer 260 followed by a solvent rinsing in some cases. Any suitable composition for forming a neutral layer 260 can be used. Non-limiting examples of suitable compositions include random copolymers of styrene and methylmethacrylate (MMA), i.e., P(S-r-MMA). The function of the neutral layer 260 (or the guiding pattern) is to facilitate perpendicular morphology and direct the orientation of BCPs.

In another embodiment (not shown), a chemical guiding pattern is used instead of the neutral layer 260. The chemical guiding pattern is formed over the lithographic stack 242. The chemical guiding pattern can have a surface topography. Alternatively, the chemical guiding pattern be substantially free of surface topography. The chemical guiding pattern can be formed from materials and methods described above for the neutral layer 260, together with lithography and etching techniques.

The BCP 262 can be a di-block copolymer of polystyrene and poly methyl methacrylate (PS-b-PMMA.) The BCP 262 can include one or more first blocks 221 and two or more second blocks 222. The first block 270 of the BCP 262 can be PMMA, and the second block 280 can be PS. Other di-block copolymers can be used for the BCP 262.

Figure 2B:
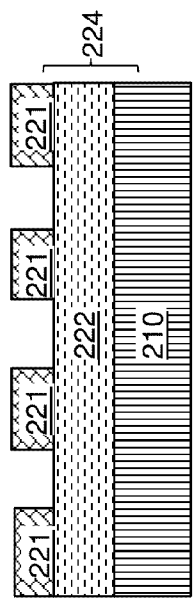
FIG. 2B illustrates a cross-sectional side view after removing a first block from the BCP.

FIG. 2B illustrates a cross-sectional side view of the semiconductor stack after selectively removing the first block 270 from the BCP 262 by RIE or a wet development process (e.g., UV irradiation followed by solvent rinsing). The second block 280 is used as an etch template. The corresponding portions of the neutral layer 260 beneath the first block 270 are also removed. After selectively removing the first blocks 270, the remaining second blocks 280 define a fin pattern. The distance between adjacent second blocks 280 initially defines the fin spacing. In one embodiment, the first block 270 is PMMA, the second block 280 is PS, and the PMMA is selectively removed using the PS as a template.

The CD ratio of the "lines" (l) defined by the second block 280 and the "spaces" (s) defined by the first block 270 is in a range from about 0.67 to about 1.5. In one embodiment, CD ratio of the lines (l) to spaces (s) is in a range from about 0.8 to about 1.2.

Figure 2C:
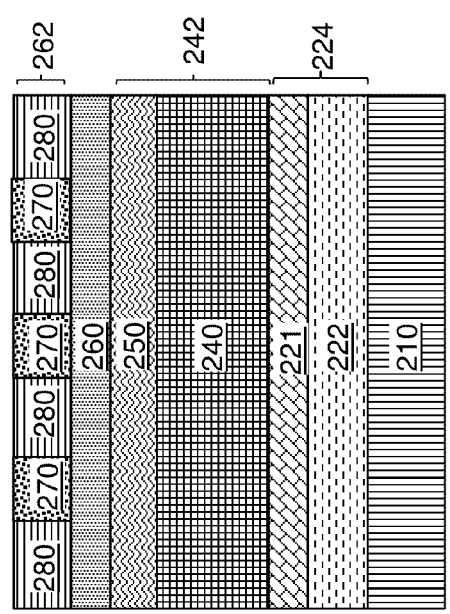
FIG. 2C illustrates a cross-sectional side view after taper etch of the OPL layer and the ARC layer.

FIG. 2C illustrates a cross-sectional side view after taper etch of the OPL layer 240 and the ARC layer 250. Taper etching is performed to grow the CD of lines and reduce the CD of the spaces, so that after the later tone inversion step the resulting CD, which is derived from the initial spaces, will be effectively "trimmed."

The ARC layer 250 and the OPL layer 240 are then etched into an additional hard mask layer to improve the pattern quality in subsequent etches (not shown). A taper etch can be used. Transferring the pattern into the ARC layer 250 and the OPL layer 240 increases the ratio of the line CD to pitch CD in a controllable way.

Figure 2D:
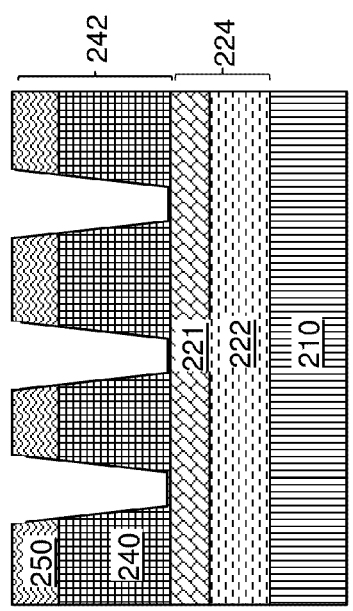
FIG. 2D illustrates a cross-sectional side view after fin pattern transfer into a first dielectric layer of the hard mask.

FIG. 2D illustrates a cross-sectional side view after fin pattern transfer into one layer of the hard mask 224. The first dielectric layer 221 of the hard mask 224 is hard mask open etched to define the fin pattern. Any remaining portions of the ARC layer 250 and the OPL layer 260 are removed/ashed away. Etching can be performed by dry etching, plasma etching, or any other suitable etching process.

Figure 3B:
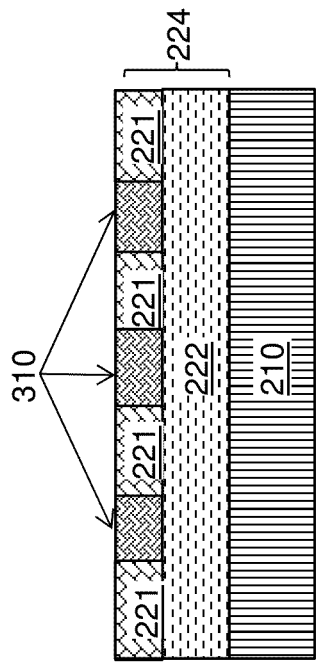
FIG. 3B illustrates a cross-sectional side view after the etch back process of the tone inversion material.
Figure 3A:
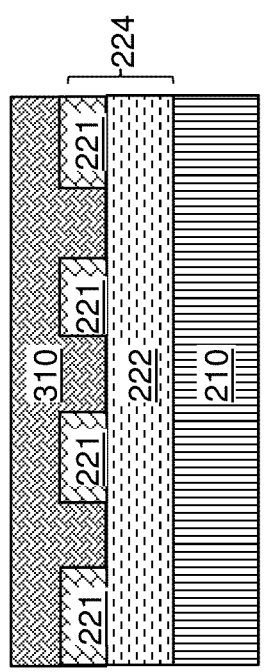
FIG. 3A illustrates a cross-sectional side view after coating with a tone inversion material.

FIG. 3A illustrates a cross-sectional side view after coating the first dielectric layer 221 with a tone inversion material 310. The tone inversion material 310 fills the fin pattern in the first dielectric layer 221 in the hard mask 224 to provide an inverted fin pattern. The tone inversion material 310 will overfill the fin pattern trenches and cover the hard mask 224, creating a planarized top surface.

The tone inversion material 310 can be a spin-on material. Non-limiting examples of suitable tone inversion materials 310 include silicon-containing polymers and spin-on metal oxides, for example, titanium anti-reflective coating (TiARC). Other suitable materials include siloxane, silsesquioxane, hydrogen silsesquioxane, spin-on metal oxide containing materials of titanium (Ti), ruthenium (Ru), tungsten (W), or hafnium (Hf), or any combination thereof.

FIG. 3B illustrates a cross-sectional side view after tone inversion back etching. Etching back the tone inversion material 310 that overfills the fin pattern in the first dielectric layer 221 removes the tone inversion material 310 that remains on top of the first dielectric layer 221. The tone inversion material 310 has an etch selectivity with respect to dielectric materials in the hard mask 224, which enables back etching.

Figure 3D:
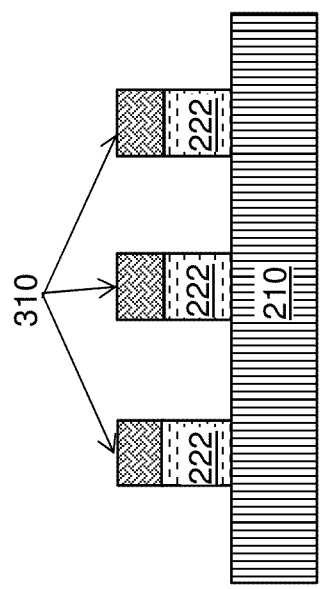
FIG. 3D illustrates a cross-sectional side view after etching through the second layer of the hard mask.
Figure 3C:
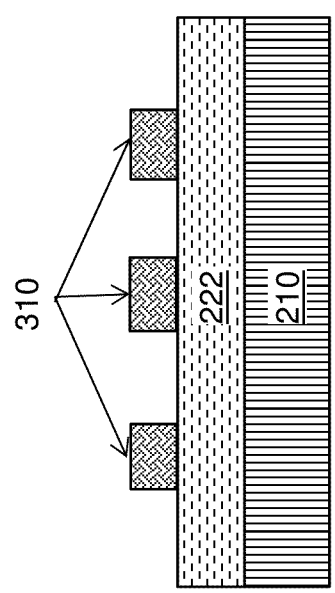
FIG. 3C illustrates a cross-sectional side view after removing the first layer of the hard mask selectively to the tone inversion material.

FIG. 3C illustrates a cross-sectional side view after removing the first dielectric layer 221. The resulting inverted fin pattern is then defined by the tone inversion material 310 over the second dielectric layer 222. The tone inversion material 310 will function as a hard mask to transfer the inverted fin pattern into the final substrate 210.

FIG. 3D illustrates a cross-sectional side view after etching the inverted fin pattern through the second dielectric layer 222. The resulting inverted fin over the substrate 210 is defined by both the tone inversion material 310 and the second dielectric layer 222. The tone inversion material 310 provides increased etch mask budget, which allows more control in defining the final fin structures. Etching can be performed by dry etching, plasma etching, or any other suitable etching process.

Figure 3F:
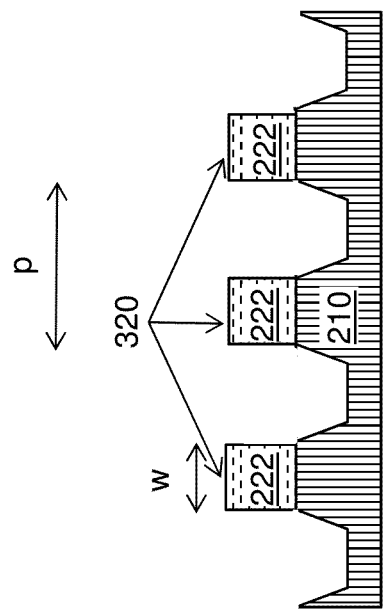
Figure 3E:
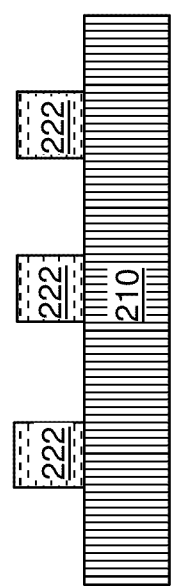
FIG. 3E illustrates a cross-sectional side view after removing the tone inversion material.

FIG. 3E illustrates a cross-sectional side view after removing the tone inversion material 310. The resulting inverted fin is defined in the second dielectric layer 222 over the substrate 210.

FIG. 3F illustrates a cross-sectional side view after final fin etching. The substrate 210 is etched to define trenches and form the final fin 320 with desired pitch p and width (or CD) w. The final fin 320 can have a pitch p in a range from about 25 to about 100 nm. The final fin 320 can have a width w in a range from about 5 to about 50 nm. The ratio of width w CD to pitch CD in the final fin 320 is typically in a range from about 0.2 to about 0.5.

The above described process provides advantages of eliminating OPL wiggling, increasing etch mask budgets, and reducing the amount of RIE shrink necessary to provide fins with desired CDs. The methods are compatible for bulk fin patterning. The disclosed methods also provide more room for final fin CD tuning.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for directed self-assembly (DSA) fin patterning, the method comprising:
   forming a block copolymer layer over a lithographic stack, the block copolymer layer having a first block and a second block, the lithographic stack disposed over a hard mask and a substrate, and the hard mask comprising a first dielectric layer and a second dielectric layer;
   removing the first block from the block copolymer to define a fin pattern in the block copolymer layer with the second block;
   etching the fin pattern into the first dielectric layer of the hard mask;
   filling the fin pattern within the first dielectric layer of the hard mask with a tone inversion material;
   etching back the tone inversion material that overfills the fin pattern and remains on top of the first dielectric layer;
   removing the first dielectric layer selectively to define an inverted fin pattern from the tone inversion material;
   etching the inverted fin pattern into the second dielectric layer of the hard mask;
   removing the tone inversion material; and
   transferring the inverted fin pattern of the second dielectric layer into the substrate to define fins.

2. The method of claim 1, wherein the tone inversion material is a spin-on metal oxide.

3. The method of claim 2, wherein spin-on metal oxide comprises titanium (Ti), ruthenium (Ru), tungsten (W), hafnium (Hf), or any combination thereof.

4. The method of claim 1, wherein the block copolymer comprises polystyrene (PS) and poly(methyl methacrylate) (PMMA).

5. The method of claim 1, further comprising a chemical guiding pattern over the lithographic stack.

6. The method of claim 5, wherein the chemical guiding pattern has a surface topography.

7. The method of claim 1, wherein the first dielectric layer is silicon oxide or silicon nitride.

8. A method for DSA fin patterning, the method comprising:
   forming a block copolymer layer over a neutral layer, the block copolymer layer having a first block and a second block, the neutral layer disposed over a lithographic stack, the lithographic stack disposed over a hard mask and a substrate, and the hard mask comprising a first dielectric layer and a second dielectric layer;
   removing the first block from the block copolymer and a corresponding portion of the neutral layer beneath the first block to define a fin pattern in the block copolymer layer with the second block;
   etching the fin pattern into the first dielectric layer of the hard mask;
   filling the fin pattern within the first dielectric layer of the hard mask with a tone inversion material;
   etching back the tone inversion material that overfills the fin pattern and remains on top of the first dielectric layer;
   removing the first dielectric layer selectively to define an inverted fin pattern from the tone inversion material;
   etching the inverted fin pattern into the second dielectric layer of the hard mask;
   removing the tone inversion material; and
   transferring the inverted fin pattern of the second dielectric layer into the substrate to define fins.

9. The method of claim 8, wherein the substrate is a silicon substrate.

10. The method of claim 8, wherein the tone inversion material is a spin-on material.

11. The method of claim 8, wherein the tone inversion material has etch selectivity over dielectric materials of the hard mask.

12. The method of claim 8, wherein the etching in the first dielectric layer or second dielectric layer is wet etching.

13. The method of claim 8, wherein the etching in the first dielectric layer or the second dielectric layer is plasma etching.

14. The method of claim 8, wherein the lithographic stack comprises an organic planarization (OPL) layer and an anti-reflective coating.

15. A method for DSA fin patterning, the method comprising:
   forming a block copolymer layer over a lithographic stack, the block copolymer having a first block and a second block, the lithographic stack disposed over a hard mask and a substrate, and the hard mask comprising a first dielectric layer and a second dielectric layer;
   removing the first block from the block copolymer to define a fin pattern in the block copolymer layer with the second block;
   etching the fin pattern into the first dielectric layer of the hard mask;
   filling the fin pattern within the first dielectric layer of the hard mask with a tone inversion material;
   etching back the tone inversion material that overfills the fin pattern and remains on top of the first dielectric layer;
   removing the first dielectric layer selectively to define an inverted fin pattern from the tone inversion material;
   etching the inverted fin pattern into the second dielectric layer of the hard mask;
   removing the tone inversion material;
   transferring the inverted fin pattern of the second dielectric layer into the substrate to define fins; and
   etching the fins into the substrate after removing the tone inversion material.

16. The method of claim 15, wherein tone inversion material is a silicon-containing polymer.

17. The method of claim 15, wherein the tone inversion material is siloxane, silsesquioxane, hydrogen silsesquioxane, or any combination thereof.

18. The method of claim 15, further comprising a chemical guiding pattern over the lithographic stack.

19. The method of claim 18, wherein the chemical guiding pattern is substantially free of a surface topography.

20. The method of claim 15, wherein the tone inversion material is etch selective to the hard mask.

* * * * *